United States Patent [19]

Murai et al.

[11] Patent Number: 5,270,250

[45] Date of Patent: Dec. 14, 1993

[54] METHOD OF FABRICATING SEMICONDUCTOR SUBSTRATE HAVING VERY SHALLOW IMPURITY DIFFUSION LAYER

[75] Inventors: Tsuyoshi Murai; Shigeaki Nakamura; Toshinori Konaka; Shigeru Mizuno, all of Tokyo, Japan

[73] Assignee: M. Setek Co., Ltd., Tokyo, Japan

[21] Appl. No.: 812,483

[22] Filed: Dec. 23, 1991

[30] Foreign Application Priority Data

Oct. 8, 1991 [JP] Japan ................................. 3-290508

[51] Int. Cl.⁵ ........................................ H01C 21/265
[52] U.S. Cl. .................................. 437/165; 437/950; 437/16
[58] Field of Search ................... 437/18, 20, 165, 172, 437/950, 16; 250/492.3

[56] References Cited

U.S. PATENT DOCUMENTS

| | | | |
|---|---|---|---|
| 4,861,729 | 8/1989 | Fuse et al. | 437/165 |
| 4,912,065 | 3/1990 | Mizuno et al. | 437/141 |
| 4,937,205 | 6/1990 | Nakayama et al. | 437/172 |
| 5,019,886 | 5/1991 | Sato et al. | 357/29 |

FOREIGN PATENT DOCUMENTS 63-299327  12/1988  Japan .

Primary Examiner—George Fourson
Attorney, Agent, or Firm—Edwin E. Greigg; Ronald E. Greigg

[57] ABSTRACT

A method of fabricating a semiconductor substrate is characterized in that a semiconductor wafer is disposed between a pair of opposite electrodes provided in an atmosphere of inert gas containing impurity gas which is held at a low pressure, a low-frequency alternating current is applied between the electrodes to induce plasma, and impurity ions are implanted into the surface of the semiconductor wafer to form a very shallow impurity diffusion layer.

1 Claim, 5 Drawing Sheets

METHOD OF FABRICATING SEMICONDUCTOR SUBSTRATE HAVING VERY SHALLOW IMPURITY DIFFUSION LAYER

BACKGROUND OF THE INVENTION

1. Field of the Invention

The present invention relates to a method of an apparatus for fabricating a semiconductor substrate having a very shallow impurity diffusion layer which is suitable for a high-frequency transistor device and a large scale integrated circuit device.

2. Description of the Background Art

A semiconductor substrate is generally fabricated by doping predetermined impurities into a semiconductor wafer to form an impurity diffusion layer on the surface of the semiconductor wafer.

Examples of a method of forming an impurity diffusion layer are generally a process of annealing impurities after pre-deposition, ion implantation, and epitaxial growth.

Meanwhile, it is preferable that a semiconductor device provided with a shallower impurity diffusion layer is used in terms of increasing the response speed in a high-frequency transistor device and increasing the integration density in a large scale integrated circuit device. Ion implantation is generally employed so as to fabricate such a semiconductor device.

However, it is difficult to form a shallow P-type diffusion layer using ion implantation, although a shallow N-type diffusion layer is formed to some extent using arsenic ion implantation.

Furthermore, examples of a method of forming a very shallow diffusion layer having a thickness of approximately 0.1 $\mu$m are low energy boron ion implantation, $BF^2$ implantation, and double implantation of boron and silicon ions. The methods have a lot of problems in terms of apparatus and process technology.

SUMMARY OF THE INVENTION

An object of the present invention is to provide a method of and an apparatus for forming a very shallow impurity diffusion layer on the surface of a semiconductor wafer stably and simply.

In order to attain the above described object, a method of fabricating a semiconductor substrate having a very shallow impurity diffusion layer according to the present invention comprises the steps of disposing a semiconductor wafer between a pair of opposite electrodes provided in an atmosphere of inert gas containing impurity gas which is held at a low pressure, applying a low-frequency alternating current between the above electrodes to induce plasma between the electrodes, and implanting impurity ions into the surface of the above semiconductor wafer.

In the method according to the present invention, impurity ions and electrons are alternately implanted into the semiconductor wafer in an electric field formed between the electrodes which alternately vary in polarity depending on a low-frequency cycle. Accordingly, the semiconductor wafer is prevented from being charged so that doping into the semiconductor wafer is controlled, thereby to form a very shallow impurity diffusion layer having a thickness of, for example, not more than 0.1 $\mu$m.

In accordance with another aspect of the present invention, 0.01 to 1 Torr and 1 hertz to several kilohertz are respectively selected as preferred conditions of the pressure of the atmosphere of inert gas containing impurity gas and the low frequency, thereby to stably form a very shallow impurity diffusion layer having a thickness of, for example, not more than 0.1 $\mu$m.

An apparatus for fabricating a semiconductor substrate according to the present invention comprises a vacuum chamber comprising a gas inlet path and a gas outlet path, a low-frequency AC power supply provided outside of the vacuum chamber, a pair of parallel plate electrodes disposed so as to be opposed to each other in the vacuum chamber and so constructed as to be connectable to the above low-frequency AC power supply, and wafer holding means for holding a semiconductor wafer either on the opposed surface of either one of the electrodes or between the electrodes.

In the forming apparatus, the semiconductor wafer is disposed either between the pair of parallel plate electrodes provided in the vacuum chamber or on the opposed surface of either one of the electrodes, the vacuum chamber is evacuated and then, inert gas and impurity gas are introduced into the vacuum chamber in a predetermined ratio to hold the vacuum chamber in a low-pressure atmosphere, a low-frequency alternating current is applied between the above parallel plate electrodes so that plasma is induced from the gases held in the low-pressure atmosphere between the electrodes, and impurity ions and electrons created by the induction of the plasma are alternately implanted into the above semiconductor wafer by the function of an AC electric field which alternately varies in a low-frequency cycle.

The above described fabricating apparatus according to the present invention may be so constructed that the semiconductor wafer can be disposed on the opposed surface of either one of the parallel plate electrodes in place of providing the wafer holding means.

It is preferable that the fabricating apparatus according to the present invention is provided with temperature adjusting means for cooling or heating the semiconductor wafer.

The heat generation of the semiconductor wafer caused by the implantation of impurity ions is restrained due to the cooling effect of the temperature adjusting means, and the impurity ions are stably implanted into the semiconductor wafer due to the heating effect of the temperature adjusting means while annealing the semiconductor wafer.

Furthermore, as the heating means in the above described temperature adjusting means, a part of the vacuum chamber is provided with a window using a translucent member such as quartz, and radiation heat generating means for generating radiation heat capable of radiating and heating the semiconductor wafer disposed in the vacuum chamber through the window is provided outside of the window.

In the above described construction, the semiconductor wafer located in the vacuum chamber is heated by radiation heat of a lamp from the outside of the vacuum chamber, so that the temperature of the semiconductor wafer is controlled.

The foregoing and other objects, features, aspects and advantages of the present invention will become more apparent from the following detailed description of the present invention when taken in conjunction with the accompanying drawings.

BRIEF DESCRIPTION OF THE DRAWINGS

The drawings show one embodiment of an apparatus for fabricating a semiconductor substrate according to the present invention, where.

DESCRIPTION OF THE PREFERRED EMBODIMENTS

The present invention will be described in detail with reference to the drawings.

Figure 1:
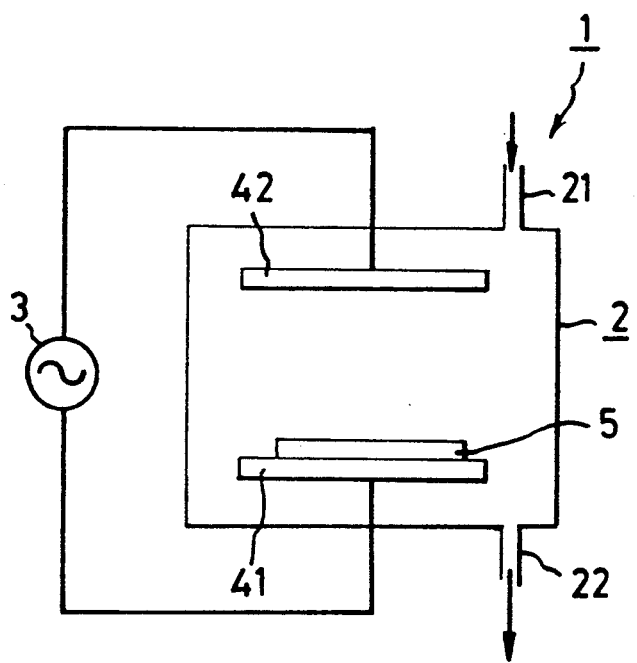
FIG. 1 is a schematic diagram showing the construction of one example of an apparatus for fabricating a semiconductor substrate which implements a method according to the present invention.

FIG. 1 is a schematic diagram showing the construction of one example of an apparatus for fabricating a semiconductor substrate which implements a method according to the present invention.

In FIG. 1, a fabricating apparatus 1 comprises a vacuum chamber comprising a gas inlet path 21 and a gas outlet path 22, an AC power supply 3 provided outside of the vacuum chamber 2, and a pair of parallel plate electrodes 41 and 42 disposed so as to be opposed to each other in the vacuum chamber 2 and so constructed as to be connectable to the above AC power supply 3. Used as the above vacuum chamber 2 is one which is the same as the conventional one comprising a gas inlet path 21 and a gas outlet path 22 and whose internal pressure can be adjusted in the range of low pressures, for example, in the range of 0.01 to 1 Torr.

In the above described fabricating apparatus 1, the parallel plate electrodes 41 and 42 are provided spaced apart from each other by approximately 50 mm in the present embodiment, which is not limited. A semiconductor wafer 5 can be held on one of the electrodes 41 by wafer holding means (not shown). In order to prevent contamination of the semiconductor wafer 5, it is preferable that the parallel plate electrodes 41 and 42 are made of an electrode material containing the same impurities as impurities to be dispersed.

A mixed gas of inert gas and impurity gas is introduced into the gas inlet path 21 from an inert gas supplying portion and an impurity gas supplying portion (not shown) through a confluent portion and a flow control portion (not shown). The above described gas inlet path 21 may be so constructed that inert gas and impurity gas are separately introduced. However, a gas inlet path 21 of such a type that their mixed gas is introduced is preferable in terms of simple construction.

A commercial frequency of 50 hertz is used for the AC power supply 3 in the present embodiment, which is not limited.

A rotary vacuum pump (not shown) is connected to the gas outlet path 22, to evacuate the vacuum chamber 2 under vacuum until a pressure reduced state where the degree of vacuum becomes, for example, approximately 0.01 to 1 Torr.

The more favorable degree of vacuum is approximately 0.01 Torr, which is not limited. Such a pressure reduced state can be considerably achieved by a normal oil-sealed rotary vacuum pump.

In a method according to the present invention, the inside of the vacuum chamber 2 is held at a low pressure in an atmosphere of inert gas containing impurity gas, and plasma is induced by applying a low-frequency alternating current between the pair of opposite electrodes 41 and 42 in the above described low-pressure atmosphere.

The above described plasma is induced in a composite atmosphere of inert gas which easily induces plasma and impurity gas for forming an objective impurity diffusion layer.

Conventionally, plasma used in the field of the semiconductor fabrication has been high-frequency induced plasma, and has been used for the purpose of etching and cleaning of a semiconductor wafer, formation of a thin film on the semiconductor wafer, and the like. The technique according to the present invention aims at directly doping impurity ions created by the induction of plasma by applying a low-frequency alternating current into a semiconductor wafer, which is different from the conventional technique using high-frequency induced plasma.

Furthermore, the method according to the present invention using the low-frequency alternating current has the advantage that the semiconductor wafer 5 disposed between the pair of opposite electrodes 41 and 42 can be prevented from being charged because impurity ions created by the induction of plasma and electrons ionized in that case can be alternately implanted into the semiconductor wafer 5 in accordance with the conversion of the polarity of each of the electrodes by the application of the AC electric field. The semiconductor wafer 5 is prevented from being charged so that doping into the semiconductor wafer 5 can be controlled, thereby to make it possible to form a very shallow and stable impurity diffusion layer in a practical range.

Examples of the low frequency used in the method according to the present invention are 1 hertz to several kilohertz, which is not limited.

Although in the method according to the present invention, the semiconductor wafer 5 is disposed in an arbitrary place between the pair of electrodes 41 and 42, the place where the semiconductor wafer 5 is disposed is suitably selected in accordance with conditions for forming a diffusion layer. For example, the semiconductor wafer 5 may be directly disposed on one of the electrodes 41, or may be held on one of the electrodes 41 through an insulating layer 6.

In the method according to the present invention, such control is carried out that the depth at which impurity ions are implanted into the semiconductor wafer 5 is not more than 0.1 μm. This control is carried out by adjusting the frequency of the above described low-frequency alternating current, the alternating current application time, the degree of vacuum, the voltage, the distance between the electrodes, and the like. In the method according to the present invention, the depth at which impurity ions are implanted can be made small as described above by lowering the voltage. For example, when the distance between the electrodes is 50 to 60 mm and the low-frequency alternating current uses a commercial frequency (50/60 Hz), the voltage can be adjusted in the range of approximately 200 to 5000 V.

In the method according to the present invention, it is preferable that the temperature of the semiconductor wafer 5 is adjusted in the range of 5° to 500° C.

In the method according to the present invention, it is possible to use as the inert gas one generally used in the art without any modification. Examples of the inert gas include Ar, He, or $N_2$ which can easily induce plasma.

Furthermore, it is possible to use as the impurity gas one generally used in the art without any modification. Examples of the impurity gas include $B_2H_6$ for forming a P-type diffusion layer and $PH_3$ or $AsH_3$ for forming an N-type diffusion layer.

Additionally, examples of the inert gas containing the impurity gas include inert gas containing 0.1 to 10% the above described impurity gas. The content of the impurity gas is preferably 0.1 to 5%, which is not limited.

Any temperature adjusting means may be used as the temperature adjusting means, provided that it can adjust the temperature of the semiconductor wafer in the range of 5° to 500° C. For example, the temperature adjusting means may be a combination of heating means such as a heater 7 and cooling means of a water cooling type.

According to the present invention, a very shallow and stable impurity diffusion layer can be formed on a semiconductor wafer, thereby to make it possible to provide a semiconductor substrate which is suitable for a high-frequency transistor device.

The diffusion layer can be formed while preventing the semiconductor wafer from being charged, thereby to make it possible to simply control doping into the semiconductor wafer.

The very shallow and stable impurity diffusion layer can be formed at a low frequency which is approximately a commercial frequency, at a low voltage and under low vacuum, so that the fabricating apparatus is very simple.

EMBODIMENT 1

Description is now made of the diffusion of impurities into the semiconductor wafer 5 respectively using an N-type silicon wafer as the semiconductor wafer 5, argon gas as inert gas, and $B_2H_6$ gas as impurity gas in the fabricating apparatus 1 of the above described construction.

First, the N-type silicon wafer is fixed to one of the electrodes 41, and the vacuum chamber 2 is evacuated by a rotary vacuum pump under vacuum until the degree of vacuum becomes, for example, approximately 0.01 Torr.

Then, argon gas (mixed gas) containing 0.5 to 1% $B_2H_6$ is introduced into the vacuum chamber 2 at a rate of approximately 10 cc/min. At this time, the evacuating capability is adjusted, to hold the inside of the vacuum chamber 2 at a pressure of 0.05 Torr.

Then, an alternating current is applied between both the electrodes 41 and 42 from the AC power supply 3, to induce plasma by electrical discharges between the electrodes 41 and 42 in the vacuum chamber 2. At this time, the applied voltage and the alternating current application time are adjusted, to make it possible to implant boron into the N-type silicon wafer to a predetermined depth.

Figure 2:
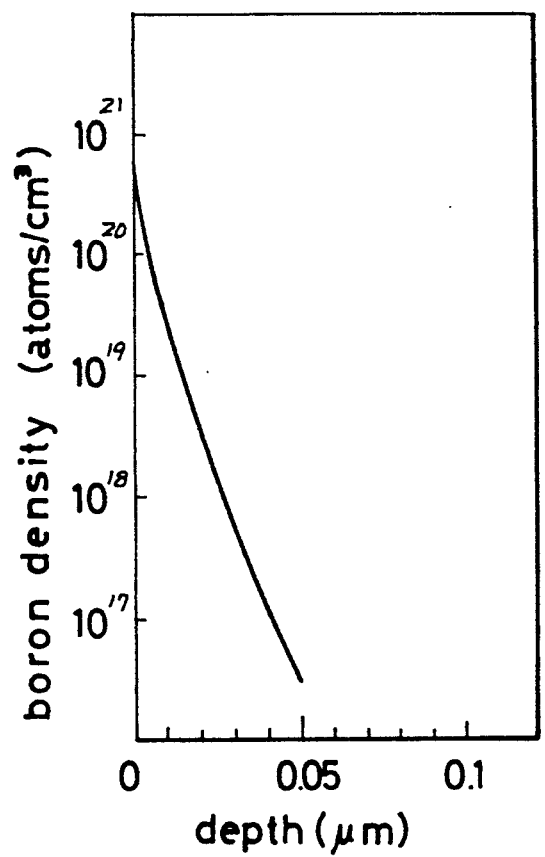
FIG. 2 is a graph for explaining the density distribution of impurities implanted into a semiconductor wafer by the fabricating apparatus shown in FIG. 1.

In the above described manner, the above described apparatus is operated with the applied voltage being 900 V and the alternating current application time being four minutes, to obtain the density distribution of boron in the N-type silicon wafer in the direction of the depth, as shown in FIG. 2.

As can be seen from FIG. 2, a very shallow boron diffusion layer having a surface density of not less than $10^{20}$ atoms/cm$^3$ and having a depth of approximately 0.05 $\mu$m is formed.

EMBODIMENT 2

Figure 3:
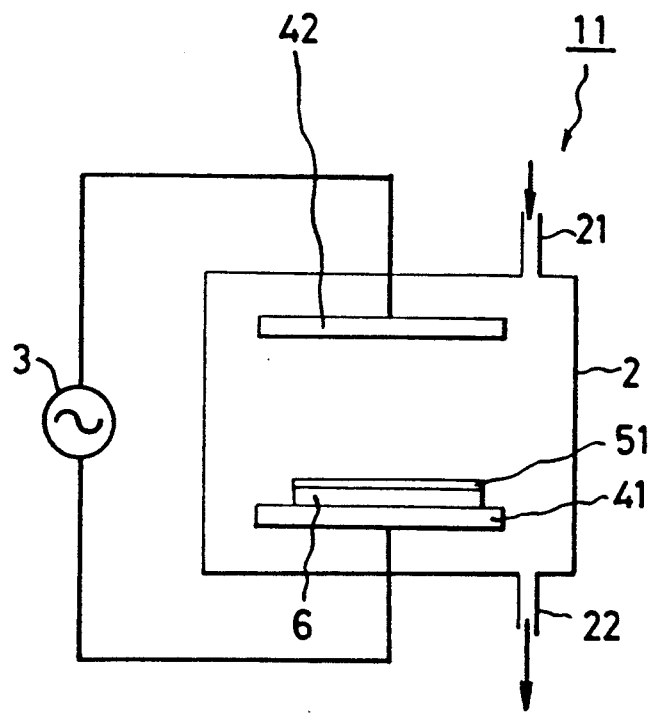
FIG. 3 is a schematic diagram showing the construction of another example of the apparatus for fabricating a semiconductor substrate which implements the method according to the present invention.

FIG. 3 is a schematic diagram showing the construction of another example of the apparatus for fabricating a semiconductor substrate which implements the method according to the present invention.

A fabricating apparatus 11 shown in FIG. 3 is based on the fabricating apparatus 1 according to the embodiment 1 but differs therefrom in that a semiconductor wafer 51 is disposed on an electrode 41 through an insulating layer 6. A thin film transistor provided on a glass substrate has the same structure. Consequently, the same reference numerals as those in the embodiment 1 denote the same members.

The above described insulating layer 6 is made of a material suitably selected from glass, ceramics, a macromolecular material and the like, and is constructed to thicknesses ranging from 10 to 1000 $\mu$m.

By the foregoing construction, when an insulating film having a thickness of approximately several micrometers is formed on the reverse surface of the semiconductor wafer, the effect of the insulating film can be reduced.

EMBODIMENT 3

Figure 4:
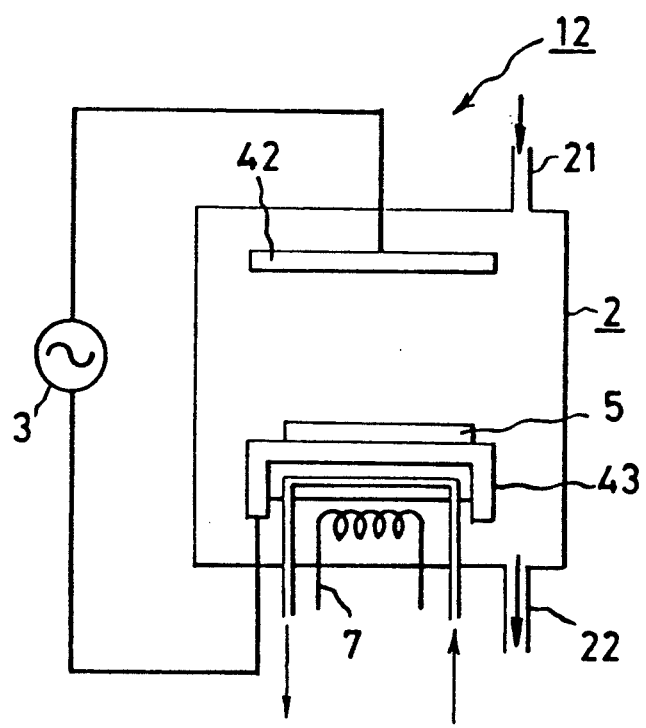
FIG. 4 is a schematic diagram showing one example of the apparatus for fabricating a semiconductor substrate according to the present invention.

An example of the apparatus for fabricating a semiconductor substrate according to the present invention is one of construction shown in FIG. 4.

A fabricating apparatus 12 shown in FIG. 4 is based on the above described fabricating apparatus 1 according to the embodiment 1 and is so constructed that a heater 7 and a water cooling type cooling pipe 8 are respectively provided such that they can exchange heat with an electrode 43 on which a semiconductor wafer 5 is disposed and fixed below the electrode 43. Consequently, the same reference numerals as those in the embodiment 1 denote the same members.

By being thus constructed, the fabricating apparatus 12 can control the temperature of the semiconductor wafer 5 in the range of 5° to 500° C., can stably implant impurity ions while annealing the semiconductor wafer 5, and can prevent damages of a masking layer and the like due to the rise in temperature by plasma.

EMBODIMENT 4

Figure 5:
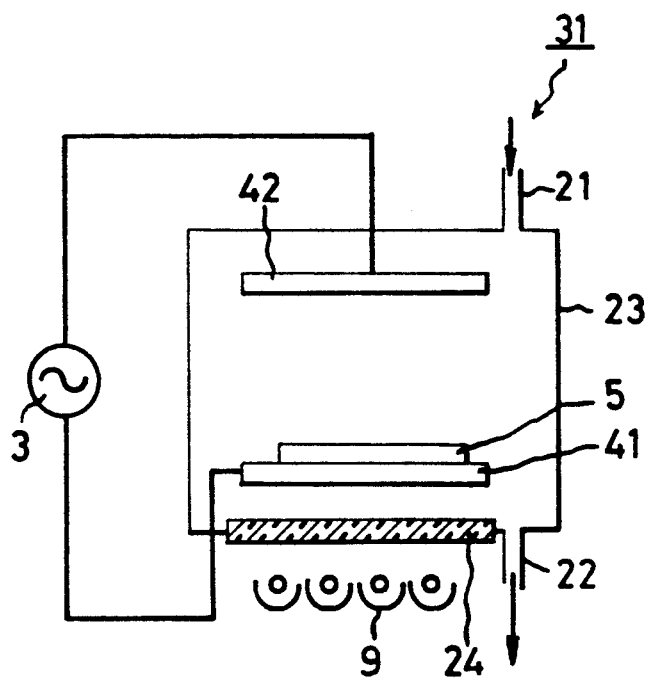
FIG. 5 is a schematic diagram showing the construction of one example of the apparatus for fabricating the semiconductor substrate according to the present invention.

An example of an apparatus for fabricating a semiconductor substrate according to the present invention is one of construction shown in FIG. 5.

A fabricating apparatus 13 shown in FIG. 5 is based on the fabricating apparatus 1 according to the above described embodiment 1 and is so constructed that a window 24 having a translucent member such as quartz is fitted thereto is provided on the wall surface of a vacuum chamber 23 opposed to an electrode 41 on which a semiconductor wafer 5 is disposed and fixed, and a lamp 9 such as a halogen lamp is provided outside of the window 24 of the vacuum chamber 23.

In the fabricating apparatus 13 shown in FIG. 5, the semiconductor wafer 5 disposed and fixed on the electrode 41 in the vacuum chamber 23 can be heated and controlled by heat radiation from the lamp 9 through the window 24. For example, when the halogen lamp is used, the temperature of the semiconductor wafer 5 can be controlled in the range from room temperature to 500° C.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor substrate having a very shallow impurity diffusion layer, comprising the steps of:

disposing a semiconductor substrate between a pair of opposite electrodes provided in an atmosphere of inert gas containing impurity gas which is held at a pressure of from about 0.01 Torr to about 1.0 Torr;

applying an alternating current of from about 1 hertz to 3 kilohertz between said electrodes to induce plasma containing impurity ions whereby the impurity ions are implanted into the surface of said semiconductor substrate to form said very shallow impurity diffusion layer.

* * * * *